US008445951B2

(12) United States Patent
Furuta et al.

(10) Patent No.: US 8,445,951 B2
(45) Date of Patent: May 21, 2013

(54) SEMICONDUCTOR INTEGRATED CIRCUIT DEVICE INCLUDING A FIN-TYPE FIELD EFFECT TRANSISTOR AND METHOD OF MANUFACTURING THE SAME

(75) Inventors: Hiroshi Furuta, Kanagawa (JP);
Takayuki Shirai, Kanagawa (JP);
Shunsaku Naga, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/407,685

(22) Filed: Feb. 28, 2012

(65) Prior Publication Data

US 2012/0153370 A1    Jun. 21, 2012

Related U.S. Application Data

(62) Division of application No. 12/656,557, filed on Feb. 3, 2010, now abandoned.

(30) Foreign Application Priority Data

Feb. 23, 2009   (JP) .................................. 2009-39916

(51) Int. Cl.
*H01L 27/108*   (2006.01)
*H01L 29/94*    (2006.01)

(52) U.S. Cl.
USPC ...... 257/306; 257/307; 257/308; 257/E27.016

(58) Field of Classification Search
USPC ........................... 257/306, 307, 308, E27.016
See application file for complete search history.

(56) References Cited

U.S. PATENT DOCUMENTS

| 7,291,877 | B2 | 11/2007 | Brederlow et al. | |
| 2006/0003526 | A1 | 1/2006 | Brederlow et al. | |
| 2008/0038888 | A1 | 2/2008 | Brederlow et al. | |
| 2009/0001438 | A1* | 1/2009 | Doyle et al. | 257/306 |
| 2010/0258908 | A1* | 10/2010 | Doyle et al. | 257/534 |
| 2011/0095372 | A1* | 4/2011 | Yuan et al. | 257/368 |
| 2011/0097889 | A1* | 4/2011 | Yuan et al. | 438/595 |

(Continued)

FOREIGN PATENT DOCUMENTS

| JP | 2006-503440 A | 1/2006 |
| WO | WO 2006/006424 A1 | 1/2006 |

OTHER PUBLICATIONS

United States Office Action dated Mar. 15, 2012, in U.S. Appl. No. 12/656,557.

*Primary Examiner* — Ngan Ngo
(74) *Attorney, Agent, or Firm* — McGinn IP Law Group, PLLC (57) ABSTRACT

A semiconductor integrated circuit device, includes a first electrode including a first semiconductor layer formed on a substrate, a side surface insulating film formed on at least a part of a side surface of the first electrode, an upper surface insulating film formed on the first electrode and the side surface insulating film, a second electrode which covers the side surface insulating film and the upper surface insulating film, and a fin-type field effect transistor. The first electrode, the side surface insulating film, and the second electrode constitute a capacitor element. A thickness of the upper surface insulating film between the first electrode and the second electrode is larger than a thickness of the side surface insulating film between the first electrode and the second electrode, and the fin-type field effect transistor includes a second semiconductor layer which protrudes with respect to the plane of the substrate.

10 Claims, 5 Drawing Sheets

U.S. PATENT DOCUMENTS

2012/0043611 A1* 2/2012 Mouli et al. ............... 257/347
2012/0119297 A1* 5/2012 Schulz ....................... 257/365
2012/0168827 A1* 7/2012 Maeda et al. ............... 257/255
2012/0168828 A1* 7/2012 Maeda et al. ............... 257/255
2012/0199909 A1* 8/2012 Schulz et al. ............... 257/351

* cited by examiner

SEMICONDUCTOR INTEGRATED CIRCUIT DEVICE INCLUDING A FIN-TYPE FIELD EFFECT TRANSISTOR AND METHOD OF MANUFACTURING THE SAME

The present application is a Divisional application of U.S. patent application Ser. No. 12/656,557, filed on Feb. 3, 2010 now abandoned, which is based on Japanese patent application No. 2009-39916, filed on Feb. 23, 2009, the entire contents of which is incorporated herein by reference.

BACKGROUND OF THE INVENTION

1. Field of the Invention

The present invention relates to a semiconductor integrated circuit device including a capacitor element, and a method of manufacturing the same.

2. Description of the Related Art

In a semiconductor integrated circuit device, a capacitor element is generally used for decoupling between a power supply and GND, determining a time constant of a circuit, or other such purpose. For example, Japanese Patent Translation Publication No. 2006-503440 discloses an integrated circuit arrangement including a capacitor. The integrated circuit arrangement described in Japanese Patent Translation Publication No. 2006-503440 includes an electrically insulating region and at least one series of regions that form a capacitor, and the capacitor includes an electrode region formed in the vicinity of the insulating region, a dielectric region, and an electrode region formed away from the insulating region in this order. The insulating region is a part of an insulating layer formed in a plane, the capacitor and at least one active element of the rated circuit arrangement are located on the same side with respect to the insulating layer, and the electrode region formed in the vicinity of the insulating region and an active region of the active element are formed in a plane parallel to the plane in which the insulating layer is formed. Here, the active element is preferably a FinFET.

A FinFET is a fin-type field effect transistor, and is a field effect transistor having a three-dimensional structure developed in order to miniaturize a metal oxide semiconductor field effect transistor (MOSFET). A FinFET receives attention as a silicon-on-insulator (SOI) device because of its excellent ability to control channel charge of a gate electrode, and the like.

A FinFET is disclosed in, for example, International Patent WO2006/006424A. The field effect transistor described in International Patent WO2006/006424A includes a semiconductor region which protrudes upward with respect to a plane of a substrate, a cap insulating film provided on an upper surface of the semiconductor region, a gate electrode which extends from above the cap insulating film to a side of the semiconductor region so as to straddle the semiconductor region and the cap insulating film, a gate insulating film interposed between the gate electrode and a side surface of the semiconductor region, and source/drain regions provided in the semiconductor region so as to sandwich a part of the semiconductor region covered by the gate electrode, and a channel region is formed in the side surface of the semiconductor region.

The following analysis is given from the viewpoint of the present invention.

In a case where a capacitor element is provided in a semiconductor integrated circuit device, for example, when a capacitor element is provided in a device including a FinFET, formation of a metal insulator metal (MIM) capacitor element utilizing a metal wiring layer is conceivable. However, in a process of forming the FinFET, usually, a low-permittivity film (low-k film) is introduced as an inter-wiring layer insulating film. Therefore, introduction of a high-permittivity film (high-k film) in order to form a MIM capacitor element increases the process cost.

Therefore, formation of a capacitor element (capacitor) utilizing a FinFET structure is examined. In this case, a gate insulating film of the FinFET is used as a capacitor insulating film of the capacitor element. However, a FinFET is generally a device used with the power supply voltage of 1 V or lower, and an extremely thin gate insulating film (for example, at a thickness of several nanometers) is used. For this reason, in this case, the capacitor insulating film of the capacitor element becomes also extremely thinner. Further, in order to reduce the area, reduction in thickness of the capacitor insulating film is also desired.

When an insulating film is made thinner as in the gate insulating film of a FinFET, because of manufacturing fluctuations, the thickness of the insulating film also fluctuates accordingly. For example, when a fin layer of a FinFET is used as a lower electrode, the thickness of the insulating film is more likely to fluctuate particularly at an end portion (in particular, at an edge portion) of the lower electrode. In addition, the electric field intensity becomes larger at the end portion (in particular, at the edge portion) of the lower electrode. Therefore, when a capacitor element is formed utilizing a FinFET structure, there arises a problem that the time dependent dielectric breakdown (TDDB) life of the insulating film becomes shorter.

In the integrated circuit arrangement described in Japanese Patent Translation Publication No. 2006-503440, the gate insulating film of the active element (transistor) and the insulating film (dielectric film) of the capacitor element (capacitor) are formed in the same process. However, shortening of the TDDB life due to fluctuations in thickness of the insulating film of the capacitor element described above is not at all taken into consideration. Further, in the capacitor element of the integrated circuit arrangement described in Japanese Patent Translation Publication No. 2006-503440, the upper electrode covers the lower electrode and the insulating film. However, shortening of the TDDB life of the insulating film due to electric field concentration at the edge portion of the electrode is not at all taken into consideration.

SUMMARY OF THE INVENTION

According to a first aspect of the present invention, there is provided a semiconductor integrated circuit device including: a first electrode including a first semiconductor layer which protrudes with respect to a plane of a substrate; a side surface insulating film formed on at least a part of a side surface of the first electrode; an upper surface insulating film formed on the first electrode and the side surface insulating film; and a second electrode which covers the side surface insulating film and the upper surface insulating film. The first electrode, the side surface insulating film, and the second electrode constitute a capacitor element. A thickness of the upper surface insulating film between the first electrode and the second electrode is larger than a thickness of the side surface insulating film between the first electrode and the second electrode.

According to a second aspect of the present invention, there is provided a semiconductor integrated circuit device including: a substrate; a semiconductor layer which protrudes with respect to the substrate; an insulating layer formed on the semiconductor layer; and an electrode layer formed on the insulating layer. At least a part of the semiconductor layer, the insulating layer, and the electrode layer constitutes a fin-type field effect transistor portion including a channel region, a source region, and a drain region which are formed as the semiconductor layer, a gate insulating film formed as the insulating layer, and a gate electrode foamed as the electrode layer. At least another part of the semiconductor layer, the insulating layer, and the electrode layer constitutes a capacitor element portion including a first electrode formed as the semiconductor layer, an insulating film formed as the insulating layer, and a second electrode formed as the electrode layer. A thickness of the insulating film on an upper surface of the first electrode of the capacitor element portion in a direction perpendicular to a plane of the substrate is larger than a thickness of the insulating film on a side surface of the first electrode of the capacitor element portion in a direction parallel to the plane of the substrate.

According to a third aspect of the present invention, there is provided a method of manufacturing a semiconductor integrated circuit device, including: forming in the same process a first semiconductor layer which protrudes with respect to a plane of a substrate and includes a first electrode of a capacitor element, and a second semiconductor layer which includes a channel region, a source region, and a drain region of a fin-type field effect transistor; forming in the same process an insulating film of the capacitor element and an insulating film of the fin-type field effect transistor; and forming in the same process a second electrode of the capacitor element and a gate electrode of the fin-type field effect transistor, whereby the capacitor element and the fin-type field effect transistor are formed on the same substrate.

The present invention has at least one of the following effects.

According to the semiconductor integrated circuit device of the present invention, by providing in the capacitor element the upper surface insulating film which is thicker than the side surface insulating film, electric field concentration at an edge portion (corner portion) of the lower electrode (first electrode) is relaxed, and thus, the life of the insulating film can be improved.

According to the method of manufacturing a semiconductor integrated circuit device of the present invention, the capacitor element and the fin-type field effect transistor can be manufactured in the same process.

DETAILED DESCRIPTION OF THE INVENTION

Embodiments of the above-mentioned first to third aspects of the present invention are described in the following.

According to an embodiment of the above-mentioned first aspect the present invention, the second electrode includes a polysilicon layer having an impurity implanted thereinto.

According to another embodiment of the above-mentioned first aspect of the present invention, a conductivity type of the first electrode is the same as a conductivity type of the second electrode.

According to a further embodiment of the above-mentioned first aspect of the present invention, an impurity concentration of the second electrode is higher than an impurity concentration of the first electrode, the first electrode is connected to a ground potential, and the second electrode is connected to a power supply potential.

According to a still further embodiment of the above-mentioned first aspect of the present invention, a conductivity type of the first electrode is different from a conductivity type of the second electrode.

According to a yet further embodiment of the above-mentioned first aspect of the present invention, the upper surface insulating film and the side surface insulating film are formed of different materials.

According to a yet further embodiment of the above-mentioned first aspect of the present invention, the upper surface insulating film includes a plurality of laminated insulating films.

According to a yet further embodiment of the above-mentioned first aspect of the present invention, the first electrode includes: a capacitor element formation portion covered by the second electrode; and a coupling portion which is not covered by the second electrode and couples a plurality of the capacitor element formation portions.

According to a yet further embodiment of the above-mentioned first aspect of the present invention, the semiconductor integrated circuit device further includes a fin-type field effect transistor. The fin-type field effect transistor includes: a second semiconductor layer which protrudes with respect to the plane of the substrate and includes a channel region, a source region, and a drain region; a gate insulating film formed on the channel region; and a gate electrode formed on the gate insulating film.

According to a yet further embodiment of the above-mentioned first aspect of the present invention, the capacitor element includes: a first capacitor element having the first electrode connected to a power supply potential and the second electrode connected to a ground potential; and a second capacitor element having the first electrode connected to the ground potential and the second electrode connected to the power supply potential.

According to an embodiment of the above-mentioned second aspect of the present invention, a capacitance of a part of the capacitor element portion which is formed on the upper surface of the first electrode is smaller than a capacitance of another part of the capacitor element portion which is formed on the side surface of the first electrode.

According to another embodiment of the above-mentioned second aspect of the present invention, an area of a surface of the capacitor element portion which extends in the direction parallel to the substrate on the upper surface of the first electrode is smaller than an area of another surface of the capacitor element portion which extends in the direction perpendicular to the substrate on the side surface of the first electrode.

According to a further embodiment of the above-mentioned second aspect of the present invention, when the substrate is seen from above, an area occupied by the fin-type field effect transistor portion is larger than an area occupied by the capacitor element portion.

According to a still further embodiment of the above-mentioned second aspect of the present invention, the fin-type field effect transistor portion and the capacitor element portion are formed in the semiconductor layer which forms a protrusion.

According to an embodiment of the above-mentioned third aspect of the present invention, the method further includes performing in the same process impurity implantation into a capacitor element formation portion of the first electrode covered by the second electrode and impurity implantation into the channel region.

According to another embodiment of the above-mentioned third aspect of the present invention, the forming in the same process a second electrode of the capacitor element and a gate electrode of the fin-type field effect transistor includes forming the second electrode and the gate electrode using a polysilicon layer, and the method further includes performing in the same process impurity implantation into the second electrode, impurity implantation into the gate electrode, and impurity implantation into the source region and the drain region.

According to a further embodiment of the above-mentioned third aspect of the present invention, in order to manufacture a capacitor element in which a conductivity type of the first electrode is the same as a conductivity type of the second electrode, a fin-type field effect transistor of a first conductivity type, and a fin-type field effect transistor of a second conductivity type, the method further includes: performing in the same process impurity implantation into a capacitor element formation portion and impurity implantation into the channel region of the fin-type field effect transistor of the first conductivity type; and performing in the same process impurity implantation into the second electrode and impurity implantation into the source region and the drain region of the fin-type field effect transistor of the second conductivity type.

Figure 1:
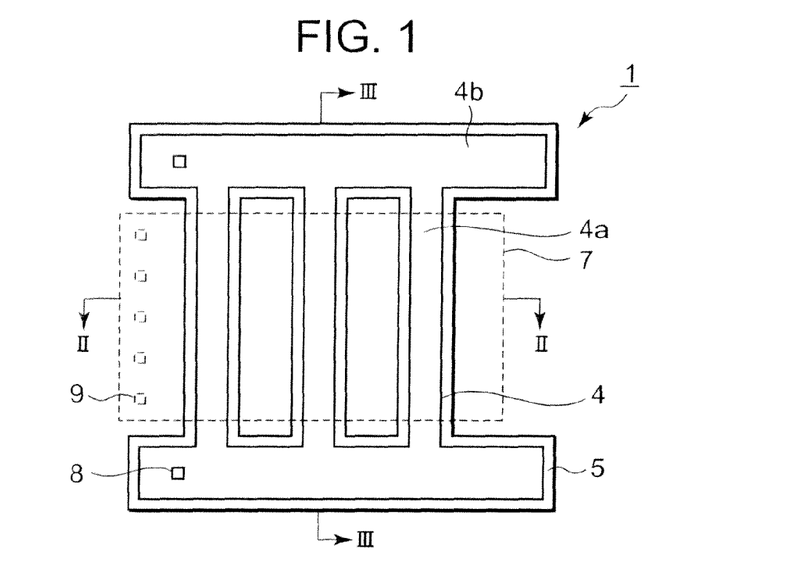
FIG. 1 is a plan view of a semiconductor integrated circuit device according to a first embodiment of the present invention.
Figure 2:
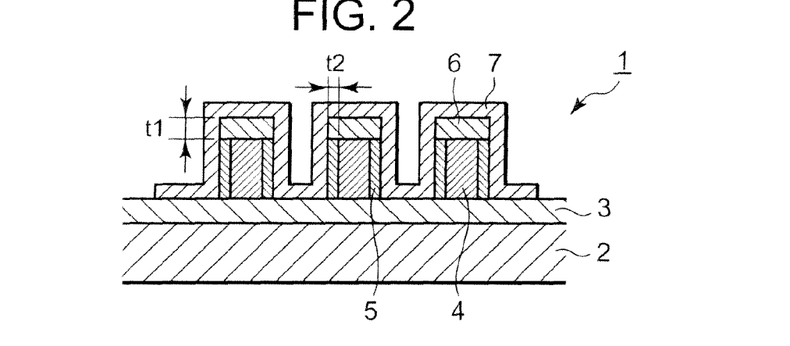
FIG. 2 is a schematic sectional view taken along the line II-II of FIG. 1.
Figure 3:
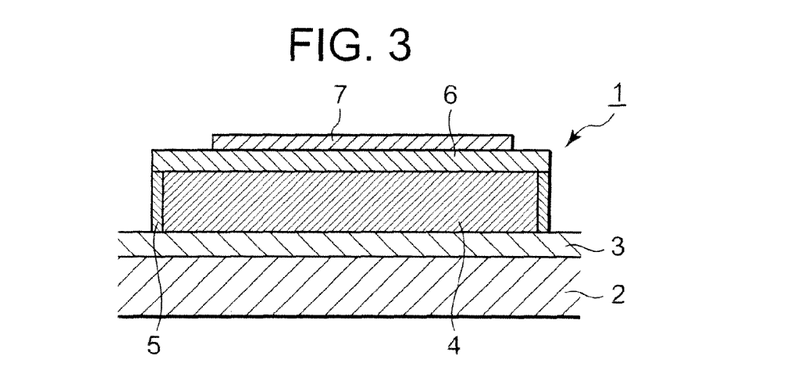
FIG. 3 is a schematic sectional view taken along the line III-III of FIG. 1.

A semiconductor integrated circuit device according to a first embodiment of the present invention is now described. FIG. 1 is a plan view of the semiconductor integrated circuit device according to the first embodiment of the present invention. FIG. 2 is a schematic sectional view taken along the line II-II of FIG. 1. FIG. 3 is a schematic sectional view taken along the line III-III of FIG. 1. In FIG. 1, an upper electrode 7 and second contacts 9 are illustrated by dotted lines and an upper surface insulating film 6 is omitted.

A semiconductor integrated circuit device 1 includes a substrate 2, an insulating layer 3, a lower electrode (first electrode) 4, a side surface insulating film (dielectric film) 5, the upper surface insulating film 6, and the upper electrode 7. The semiconductor integrated circuit device 1 includes capacitor elements having the lower electrode 4, the side surface insulating film 5, and the upper electrode (second electrode) 7.

In the semiconductor integrated circuit device 1, the substrate 2 and the insulating layer 3 are laminated in this order from the bottom.

The lower electrode 4 is formed, on the insulating layer 3, as a first semiconductor layer which protrudes above the substrate (in a fin-like or convex shape). As the lower electrode 4, an impurity diffused semiconductor layer, for example, can be used. The lower electrode 4 is covered by the upper electrode 7, and has a plurality of capacitor element formation portions 4a which form capacitor elements and coupling portions 4b which are not covered by the upper electrode 7 and couple the plurality of capacitor element formation portions 4a. In the embodiment illustrated in FIG. 1, the plurality of capacitor element formation portions 4a extend so as to be parallel to one another. The coupling portions 4b are connected to both ends of the capacitor element formation portions 4a. The coupling portions 4b are electrically connected via first contacts 8 to power supply potential wiring or ground potential wiring.

The side surface insulating film (dielectric film) 5 is formed on a side surface of the lower electrode 4. As the side surface insulating film 5, a high-permittivity film (high-k film) or an $SiO_2$ film, for example, can be used. In the following, the lower electrode 4 and the side surface insulating film, or, the lower electrode 4, the side surface insulating film 5, and the upper surface insulating film 6 may be collectively referred to as "protrusions".

The upper surface insulating film 6 is formed on an upper surface of the lower electrode 4 and on the side surface insulating film 5 (on the protrusions). A film thickness t1 of the upper surface insulating film 6 is preferably larger than a film thickness t2 of the side surface insulating film 5. As the upper surface insulating film 6, a high-permittivity film (high-k film) or an $SiO_2$ film, for example, can be used. The upper surface insulating film 6 may be formed of the same material as that of the side surface insulating film 5, or may be formed of a material which is different from that of the side surface insulating film 5. Further, the upper surface insulating film 6 may be multilayered (lamination). For example, when the side surface insulating film 5 is formed, an insulating film may be additionally laminated on an insulating film formed on the upper surface of the lower electrode 4.

The upper electrode 7 is formed so as to partially cover the protrusions including the lower electrode 4 (in particular, the capacitor element formation portions 4a), the side surface insulating film 5, and the upper surface insulating film 6. In the embodiment illustrated in FIGS. 1 and 2, the upper electrode 7 covers a plurality of protrusions without a break. As the upper electrode 7, a metal film or polysilicon with an impurity diffused therein, for example, can be used. The upper electrode 7 is electrically connected via the second contacts 9 to the ground potential wiring or the power supply potential wiring. The second contacts 9 are contacts for connecting the upper electrode 7 to a metal wiring layer (not shown) above the upper electrode 7, and, as illustrated in FIG. 1, are provided in a region which is not over the capacitor element formation portions 4a. According to the present invention, because the upper surface insulating film 6 exists, the second contacts 9 may be connected to a portion of the upper electrode 7, which is on the upper surface insulating film 6.

In the semiconductor integrated circuit device 1, the lower electrode 4 and the upper electrode 7 are opposed to each other with the side surface insulating film 5 and the upper surface insulating film 6 sandwiched therebetween. In this way, the capacitor elements are formed. According to the present invention, because the side surfaces of the protrusions are utilized, the capacitance can be made larger without increasing the area. Further, by making thicker the upper surface insulating film 6 than the side surface insulating film 5, effects of fluctuations in thickness of the insulating film and of electric field concentration at an edge portion (corner portion) of the lower electrode 4 are reduced (preferably, an effective capacitance is not formed on the upper surface of the lower electrode 4). More specifically, the capacitance formed on the upper surface of the lower electrode 4 is preferably smaller than the capacitance formed on the side surface of the lower electrode 4. This can make longer the TDDB life.

The dimensions and the shapes of the lower electrode 4 and the upper electrode 7 (for example, the number and the dimensions of the capacitor element formation portions 4a) may be appropriately set depending on the desired capacitance, CR time constant, and the like. For example, the area of the upper surface of the lower electrode 4 which extends in parallel to a surface of the substrate (width of the lower electrode 4) is preferably smaller than the area of the side surface of the lower electrode 4 which extends perpendicularly to the surface of the substrate (height of the lower electrode 4). Further, the number of the first contacts 8 and the second contacts 9 and the intervals between the first contacts 8 and between the second contacts 9 may also be appropriately set depending on the resistances of the lower electrode 4 and the upper electrode 7 and the like.

By providing the coupling portions 4b in the lower electrode 4, the flexibility in location in which the first contacts 8 are formed can be made greater. Further, by appropriately changing the shape of the coupling portions 4b, desired capacitance and layout can be obtained with ease. For example, the lower electrode 4 is divided into blocks each having a predetermined unit capacitance and a mask pattern thereof is registered. When a plurality of the blocks are necessary, by changing the shape of the coupling portions 4b, the plurality of the blocks can be combined with ease.

Further, the resistances of the lower electrode 4 and the upper electrode 7 may be lowered by laminating an additional metal layer or forming a silicide.

The semiconductor integrated circuit device 1 may include a FinFET in addition to the capacitor elements. Here, the FinFET has a second semiconductor layer which protrudes with respect to the plane of the substrate, and a channel region, a source region, and a drain region of the FinFET are formed in the second semiconductor layer. A gate insulating film and a gate electrode are formed above the channel region. The gate insulating film may be formed both on a side surface and on an upper surface of the channel region. Alternatively, similarly to the side surface insulating film of the capacitor elements, the gate insulating film may be formed only on the side surface of the channel region. When the gate insulating film is formed only on the side surface of the channel region, an insulating film similar to the upper surface insulating film of the capacitor elements is preferably formed on the upper surface of the channel region.

Next, a method of manufacturing the semiconductor integrated circuit device according to the first embodiment of the present invention is described. FIG. 4 schematically illustrates manufacturing steps for describing an example of a method of manufacturing a semiconductor integrated circuit device according to the first embodiment of the present invention. The manufacturing method according to the first embodiment is a manufacturing method when the conductivity type of the lower electrode 4 is different from the conductivity type of the upper electrode 7.

Figure 4A:
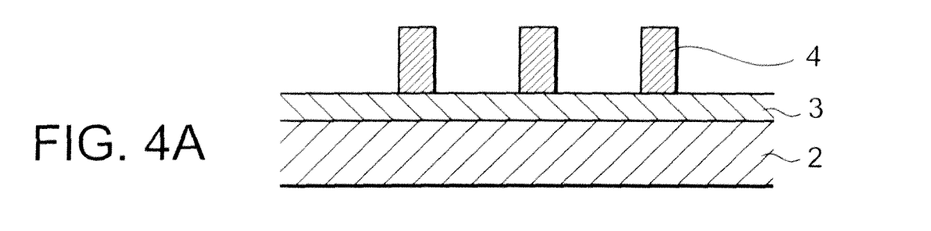
FIGS. 4A to 4E schematically illustrate an example of manufacturing steps of a method of manufacturing the semiconductor integrated circuit device according to the first embodiment of the present invention.

First, a semiconductor layer (silicon layer) which is to be the lower electrode 4 is formed on the insulating layer 3 of the SOI substrate and is patterned in a predetermined shape. The semiconductor layer may be patterned by, for example, lithography. Then, a predetermined impurity is ion implanted into the semiconductor layer to form the lower electrode 4 (FIG. 4A). Depending on the height of the semiconductor layer, the impurity may be implanted by oblique rotation ion implantation.

Figure 4B:
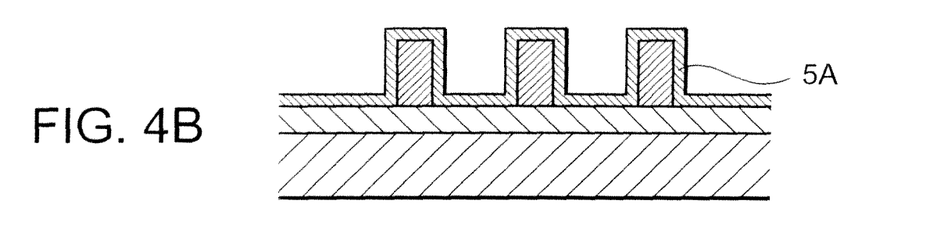
Figure 4C:
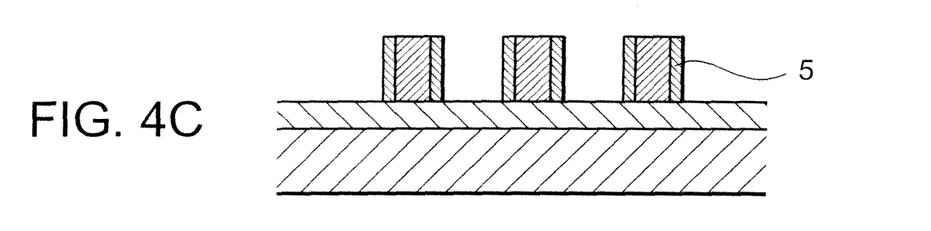
Figure 4D:
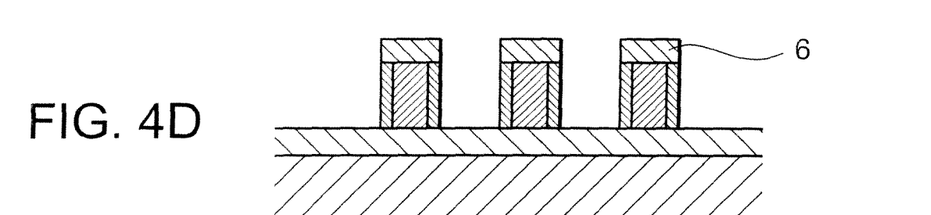

Then, a side surface insulating film precursor layer 5A which is to be the side surface insulating film 5 is formed all over the surface by, for example, CVD (FIG. 4B). Then, the side surface insulating film precursor layer 5A is etched back to form the side surface insulating film 5 on the side surface of the lower electrode 4 (FIG. 4C). Next, the upper surface insulating film 6 is formed on the lower electrode 4 and the side surface insulating film 5 using a mask (not shown) or the like (FIG. 4D).

Figure 4E:
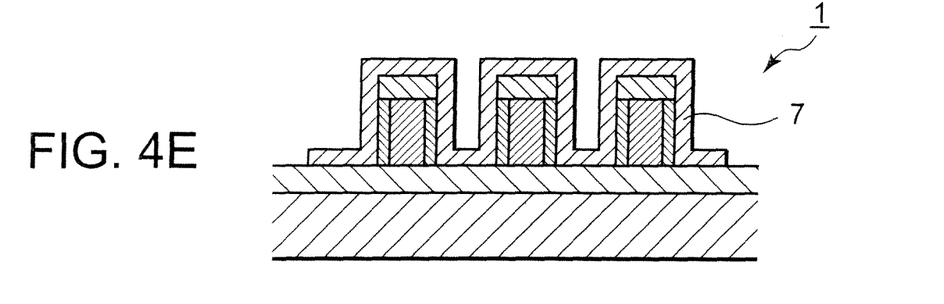

Then, the upper electrode 7 is formed in a predetermined region. The upper electrode 7 may be formed of, for example, a polysilicon layer or a metal layer. When the upper electrode 7 is formed of a polysilicon layer, after the polysilicon layer which is to be the upper electrode 7 is formed on the capacitor element formation portions 4a of the lower electrode 4, an impurity is ion implanted into the polysilicon layer to form the upper electrode 7 (FIG. 4E). Depending on the height of the protrusions (lower electrode 4), the impurity may be implanted by oblique rotation ion implantation. When polysilicon is used, even when the distance between the protrusions (space in the lower electrode 4 (in the side surface insulating film 5)) is small, the upper electrode 7 can be formed with the distance between the protrusions being maintained. To make smaller the space in the lower electrode 4 makes it possible to reduce the layout area of the capacitor elements.

Then, the first contacts 8 for electrical connection between the lower electrode 4 and the power supply potential wiring or the ground potential wiring are formed, and the second contacts for electrical connection between the upper electrode 7 and the ground potential wiring or the power supply potential wiring are formed (not shown). In this way, the semiconductor integrated circuit device 1 can be manufactured.

According to the above-mentioned manufacturing method, when the semiconductor integrated circuit device 1 includes the capacitor elements and the FinFET, the capacitor elements in the semiconductor integrated circuit device according to the present invention can be formed simultaneously with the FinFET (not shown). More specifically, when the semiconductor layer of the lower electrode 4 of the capacitor elements is formed (FIG. 4A), the semiconductor layer which is to be the channel region, the source region, and the drain region of the FinFET can be formed in the same process. When the side surface insulating film 5 of the capacitor elements is formed (FIGS. 4B and 4C), the gate insulating film of the FinFET can be formed in the same process. Then, when the upper electrode 7 of the capacitor elements is formed (FIG. 4E), the gate electrode of the FinFET can be formed in the same process.

When the FinFET and the capacitor elements are formed in the same process, impurity implantation into the lower electrode 4 (capacitor element formation portions 4a and coupling portions 4b) of the capacitor elements and impurity implantation into the channel region of the FinFET are carried out at the same time (here, the impurity is implanted not only into the channel region but also into regions which are to become the source region and the drain region). Therefore, the conductivity type and the impurity concentration of the lower electrode 4 of the capacitor elements are the same as the conductivity type and the impurity concentration of the channel region of the FinFET. When the upper electrode 7 of the capacitor elements and the gate electrode of the FinFET are formed of polysilicon, impurity implantation into the upper electrode 7 of the capacitor elements and impurity implantation into the gate electrode of the FinFET are carried out at the same time. Further, when the impurity is implanted into the upper electrode 7 and the gate electrode, the impurity is also implanted at the same time into the source region and the drain region of the FinFET which are not covered by the gate electrode. Here, a mask is formed on the coupling portions 4b of the capacitor elements so as to prevent impurity implantation thereinto. This makes the conductivity type of the upper electrode 7 of the capacitor elements the same as the conductivity type of the gate electrode, the source region, and the drain region of the FinFET, and the conductivity type of the upper electrode 7 of the capacitor elements is different from the conductivity type of the lower electrode 4 of the capacitor elements. It is to be noted that, if both an n-type FinFET and a p-type FinFET are formed, when the impurity having a conductivity type different from the conductivity type of the capacitor element formation portions 4a is implanted into the source region and the drain region of a FinFET of one conductivity type, the coupling portions 4b may be masked, and, when an impurity having a conductivity type the same as the conductivity type of the capacitor element formation portions 4a is implanted into the source region and the drain region of a FinFET of the other conductivity type, the impurity may be implanted also into the coupling portions 4b. Further, the impurity concentrations of the respective regions of the capacitor elements and the impurity concentration of the respective regions of the FinFET may be independently adjusted in order to adjust the work function.

When the upper electrode 7 and the gate electrode are formed of a metal material, it is not necessary to implant an impurity into the upper electrode 7 and the gate electrode, and an impurity is implanted into at least the source region and the drain region of the FinFET. Here, it is not necessary to implant an impurity into the coupling portions 4b of the lower electrode 4 of the capacitor elements, but an impurity may be implanted thereinto at the same time. Further, ion implantation may be carried out with regard to the upper electrode 7 and the gate electrode as necessary.

According to this embodiment, because the capacitor elements are formed utilizing a FinFET structure, the FinFET and the capacitor elements can be formed in the same process.

A semiconductor integrated circuit device according to a second embodiment of the present invention is now described. In the manufacturing method according to the first embodiment, in the capacitor elements in which the upper electrode 7 is formed of polysilicon, the conductivity type of the capacitor element formation portions 4a of the lower electrode 4 is different from the conductivity type of the upper electrode 7. In this embodiment, in the semiconductor integrated circuit device illustrated in FIGS. 1 to 3, the conductivity type of the capacitor element formation portions 4a of the lower electrode 4 is the same as the conductivity type of the upper electrode 7. In the following, a case in which the capacitor element formation portions 4a of the lower electrode 4 of the capacitor elements are formed of an n-type semiconductor layer (silicon layer) while the upper electrode 7 is formed of an n-type polysilicon layer is described.

Figure 5:
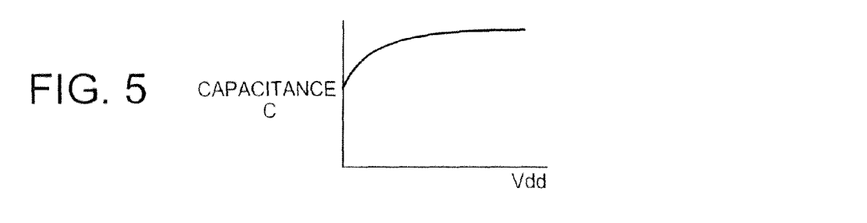
FIG. 5 is a schematic graph showing dependence of capacitance on voltage en a potential of a lower electrode of a capacitor element is a GND potential and a potential of an upper electrode of the capacitor element is a power supply potential in a second embodiment of the present invention.

When the semiconductor integrated circuit device 1 includes capacitor elements, an n-type FinFET, and a p-type FinFET, the capacitor elements and the FinFETs can be formed in the same process. When the capacitor elements and the FinFETs are formed in the same process, the impurity concentration of the capacitor element formation portions 4a of the lower electrode 4 in the capacitor elements is lower than the impurity concentration of the upper electrode 7. Here, when the potential of the upper electrode 7 is made higher than the potential of the lower electrode 4, that is, when the upper electrode 7 is connected to the power supply potential (for example, 1 V) and the lower electrode 4 is connected to the ground potential (GND), the capacitor elements can be operated as "storage capacitors". FIG. 5 is a schematic graph showing the dependence of capacitance on voltage when the potential of the lower electrode 4 of the capacitor elements is GND potential and the potential of the upper electrode 7 of the capacitor elements is the power supply potential. In this embodiment, even when the voltage fluctuates, the capacitance does not fluctuate greatly. In particular, even when the voltage drops, a depletion mode is avoided and the capacitance does not become extremely small. Therefore, according to this embodiment, the bias dependence of the capacitor elements can be made smaller.

Figure 6:
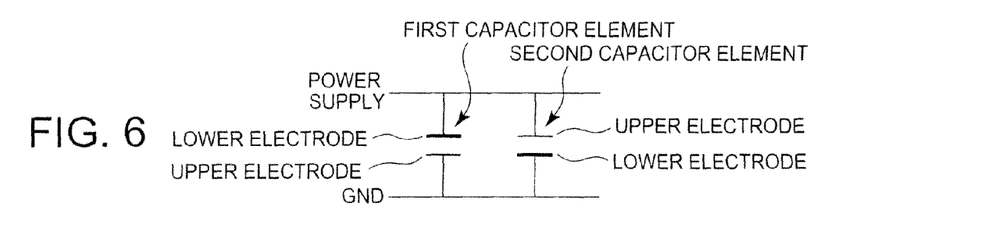
FIG. 6 is a circuit diagram illustrating an example of reducing bias dependence.

When the bias dependence of the capacitor elements is required to be further smaller, as illustrated in a circuit diagram of FIG. 6, in a first capacitor element, the upper electrode is connected to the GND potential and the lower electrode is connected to the power supply potential, while, in a second capacitor element, the upper electrode is connected to the power supply potential and the lower electrode is connected to the GND potential. In this way, by providing, in a pair, capacitor elements having electrode potentials thereof mutually opposite, the bias dependence can be apparently made smaller.

Next, a method is described in which capacitor elements having the lower electrode 4 and the upper electrode 7 of the same conductivity type are formed in the same process as the process of forming an n-type FinFET and a p-type FinFET. It is to be noted that, in the n-type FinFET, the source region and the drain region are of the n-type and the channel region is of the p-type. In the p-type FinFET, the source region and the drain region are of the p-type and the channel region is of the n-type.

A method of forming the respective components of the capacitor elements in this embodiment is the same as the method described in the first embodiment. In the following, a manufacturing method is described mainly with regard to a process in which the lower electrode 4 and the upper electrode 7 of the capacitor elements are made to be of the same conductivity type (n-type).

First, impurity implantation into the lower electrode 4 of the capacitor elements is carried out in the same process as the process of impurity implantation into the semiconductor layer of the p-type FinFET (corresponding to FIG. 4A). By doing so, the lower electrode 4 and the channel region of the p-type FinFET are lightly doped and are made to be of the n-type, and the impurity concentration of the lower electrode 4 is the same as the impurity concentration of the channel region of the p-type FinFET. Further, another impurity is implanted into the semiconductor layer of the n-type FinFET to determine the concentration (p-type) of the channel region. In the process of one of the n-type impurity implantation and the p-type impurity implantation, the region in which the other impurity implantation is carried out is preferably masked to prevent the impurity implantation.

Then, impurity implantation into the upper electrode 7 of the capacitor elements is carried out in the same process as the process of impurity implantation into the gate electrode, the source region, and the drain region of the n-type FinFET (corresponding to FIG. 4E). By doing so, the upper electrode 7 of the capacitor elements and the gate electrode, the source region, and the drain region of the FinFET are made to be of the n-type. Here, a mask is formed on the p-type FinFET so as to prevent the n-type impurity to be implanted thereinto. Similarly, the capacitor elements and the n-type FinFET are masked and a p-type impurity is implanted into the gate electrode, the source region, and the drain region of the p-type FinFET.

This makes it possible to form the capacitor elements having the lower electrode 4 and the upper electrode 7 of the same conductivity type, the n-type FinFET, and the p-type FinFET in the same process.

It is to be noted that, in the above-mentioned manufacturing method, when no impurity is implanted into the channel region of the p-type FinFET, or when the impurity concentration of the lower electrode 4 is required to be higher than the impurity concentration of the channel region of the p-type FinFET, a process of implanting an n-type impurity into the lower electrode 4 of the capacitor element may be added. Further, by forming the upper electrode 7 so as to be in a narrow stripe shape and by implanting an n-type impurity into the upper electrode 7, horizontal diffusion in the lower electrode 4 may make higher the impurity concentration.

In the above description of the second embodiment, a case in which the lower electrode 4 and the upper electrode 7 are of the n-type is described. However, it goes without saying that the lower electrode 4 and the upper electrode 7 may be of the p-type.

Figure 7:
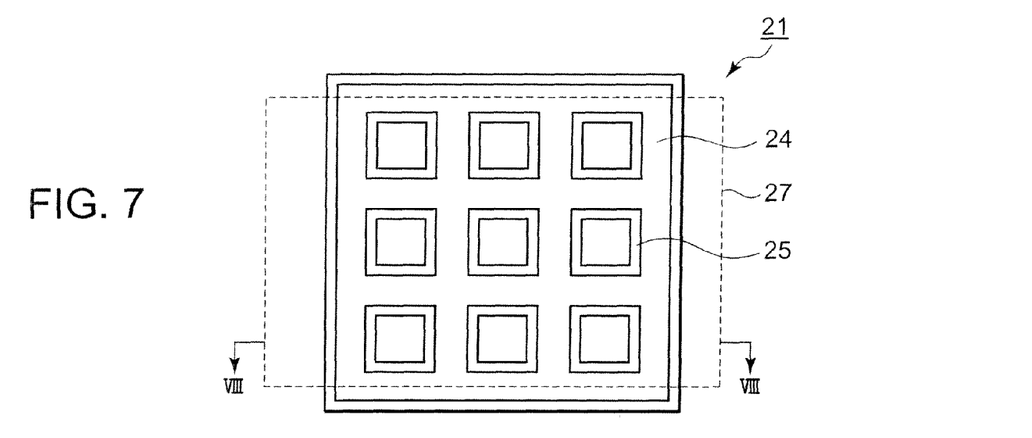
FIG. 7 is a schematic plan view of a semiconductor integrated circuit device according to a third embodiment of the present invention.
Figure 8:
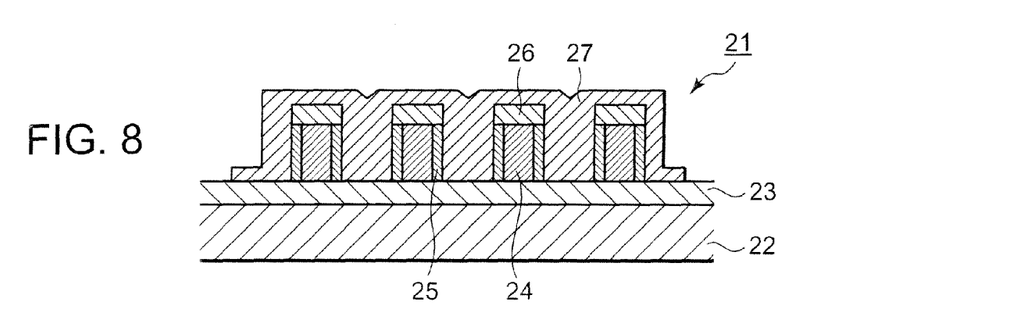
FIG. 8 is a schematic sectional view taken along the line VIII-VIII of FIG. 7.

Next, a semiconductor integrated circuit device according to a third embodiment of the present invention is described. FIG. 7 is a plan view of the semiconductor integrated circuit device according to the third embodiment of the present invention. FIG. 8 is a schematic sectional view taken along the line VIII-VIII of FIG. 7. In FIG. 7, an upper electrode 27 is illustrated by dotted lines and an upper surface insulating film 26 is omitted. Further, in FIGS. 7 and 8, contacts are omitted. In this embodiment, the shape of the lower electrode in plan view is different from that in the first embodiment.

In this embodiment, a lower electrode 24 is formed so as to be in a lattice shape to increase the side surface area in order to increase the capacitance. More specifically, the lower electrode 24 is shaped so as to have a plurality of openings (rectangular-tube-shaped through holes). A side surface insulating film 25 is formed on the side surface of the lower electrode 24 including the inner side surfaces of the openings. The upper electrode 27 is formed so as to fill the openings formed by the lower electrode 24 and the side surface insulating film 25. That the upper surface insulating film 26 is formed on the lower electrode 24 and the side surface insulating film 25 is similar to the case of the first embodiment.

Figure 9A:
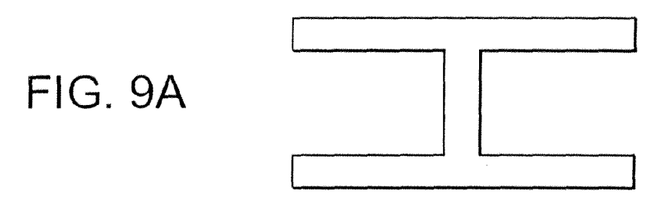
FIGS. 9A and 9B are schematic plan views illustrating exemplary shapes of the lower electrode in plan view.
Figure 9B:
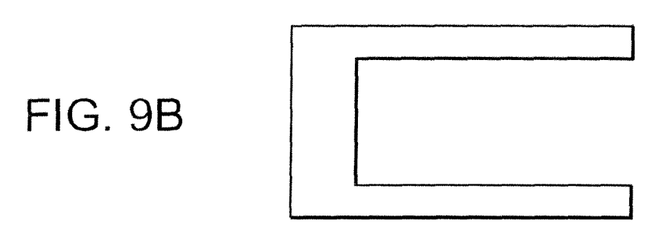

The shape of the lower electrode 24 in plan view is not limited to the shape illustrated in FIGS. 7 and 8, and the lower electrode 24 may have various appropriate shapes insofar as the side surface area is increased. For example, the lower electrode 24 may be H-shaped (or T-shaped) as illustrated in FIG. 9A, or may be U-shaped (or L-shaped) as illustrated in FIG. 9B.

The third embodiment is otherwise similar to the first embodiment.

Figure 10:
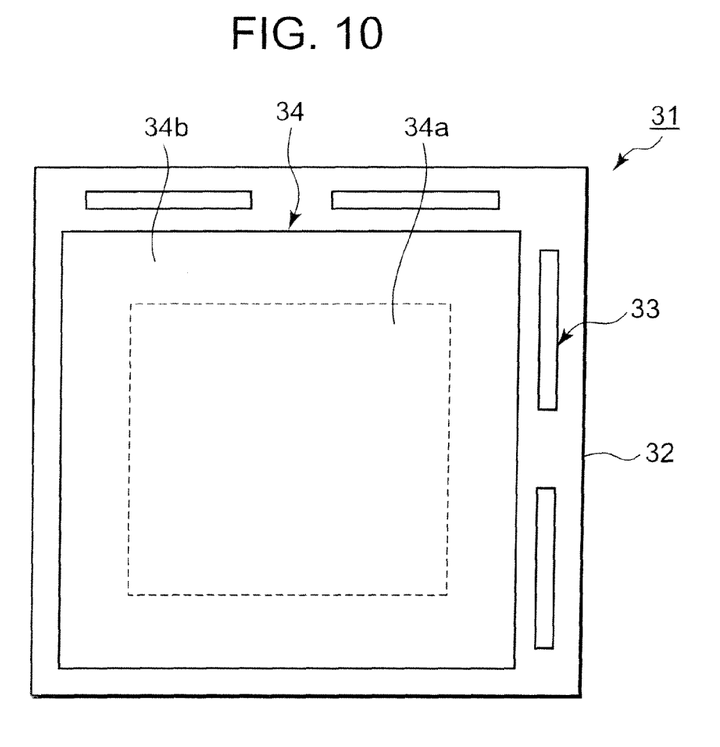
FIG. 10 is a schematic plan view of a semiconductor integrated circuit device according to a fourth embodiment of the present invention.

Next, a semiconductor integrated circuit device according to a fourth embodiment of the present invention is described. FIG. 10 is a schematic plan view of the semiconductor integrated circuit device according to the fourth embodiment of the present invention.

A semiconductor integrated circuit device 31 includes a substrate 32, capacitor element portions 33 formed on the substrate 32, and a fin-type field effect transistor portion 34 formed on the substrate 32. The capacitor element portions 33 and the fin-type field effect transistor portion 34 are structured similarly to the cases in the above-mentioned first to third embodiments.

The fin-type field effect transistor portion 34 includes, when, for example, used as a memory, a memory cell transistor portion 34a and a peripheral transistor portion 34b. In this embodiment illustrated in FIG. 10, when the substrate 32 is seen from the above, the area of the fin-type field effect transistor portion 34 is larger than the area of the capacitor element portions 33.

Because the capacitor element portions 33 form capacitors on side surfaces of protrusions (in a direction perpendicular to the substrate 32), even when large capacitance is necessary, such as, when decoupling is carried out, the area occupied by the capacitor element portions 33 when the substrate 32 is seen from the above can be suppressed. Further, the capacitor element portions 33 can be formed in a region in which the fin-type field effect transistor portion 34 is not formed (for example, a surplus region).

The fourth embodiment is otherwise similar to the first embodiment.

Figure 11:
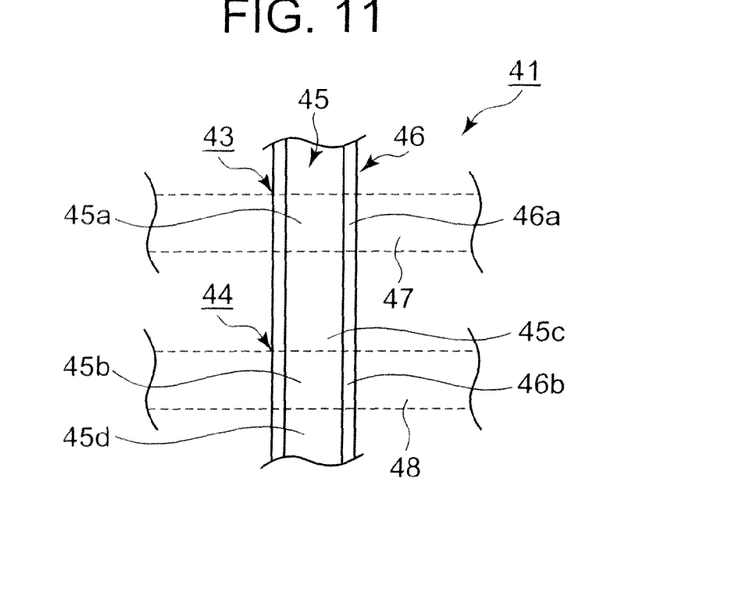
FIG. 11 is a schematic plan view of a semiconductor integrated circuit device according to a fifth embodiment of the present invention.

Next, a semiconductor integrated circuit device according to a fifth embodiment of the present invention is described. FIG. 11 is a schematic plan view of the semiconductor integrated circuit device according to the fifth embodiment of the present invention. Here, in FIG. 11, an upper electrode 47 and a gate electrode 48 are illustrated by dotted lines, and an upper surface insulating film is omitted.

A semiconductor integrated circuit device 41 includes on a substrate (not shown) a semiconductor layer 45 which protrudes with respect to the substrate, an insulating layer 46 formed on an upper u and a side surface of the semiconductor layer 45 (the insulating layer 46 on the upper surface of the semiconductor layer 45 is not illustrated), and an electrode layer (upper electrode 47 and gate electrode 48) formed on the semiconductor layer 45 and the insulating layer 46. According to this embodiment, a capacitor element portion 43 and a fin-type field effect transistor portion 44 are formed for one semiconductor layer 45. The capacitor element portion 43 and the fin-type field effect transistor portion 44 are structured similarly to the cases in the above-mentioned first to third embodiments. More specifically, a portion of the semiconductor layer 45 on which the upper electrode 47 is formed functions as a lower electrode 45a while a portion of the semiconductor layer 45 on which the gate electrode 48 is formed functions as a channel region 45b. Further, portions of the semiconductor layer 45 which are on both sides of the channel region 45b function as a source region 45c and a drain region 45d. With regard to the insulating layer 46, a portion of the insulating layer 46 on which the upper electrode 47 is formed functions as an insulating film 46a which forms a capacitor element while a portion of the insulating layer 46 on which the gate electrode 48 is formed functions as a gate insulating film 46b.

The fifth embodiment is otherwise similar to the first embodiment.

Figure 12A:
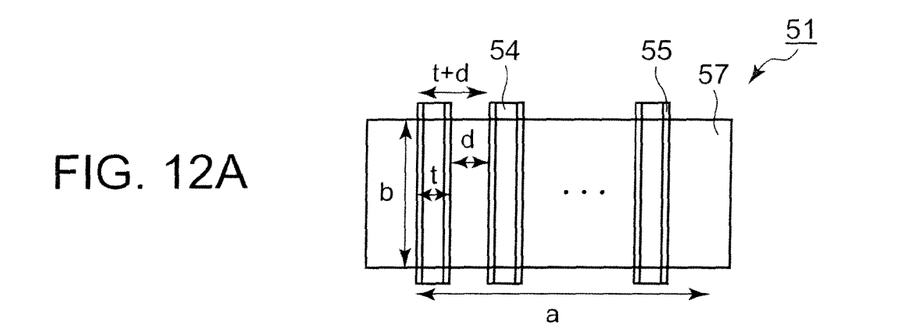
FIGS. 12A and 12B are schematic views for comparing an area of the capacitor element in the semiconductor integrated circuit device of the present invention with a layout area of a plate-type capacitor element provided in parallel to a substrate.
Figure 12B:
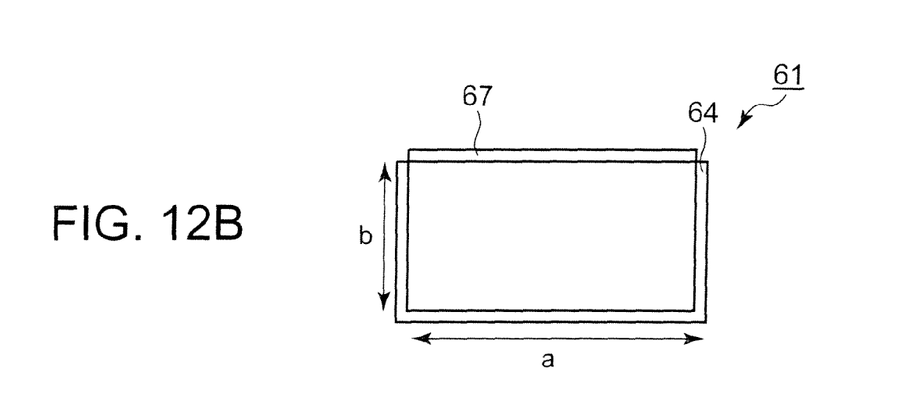

The area of the capacitor element in the semiconductor integrated circuit device of the present invention with respect to the layout area and the area of a plate-type capacitor element parallel to a plane of a substrate are compared and examined. FIGS. 12A and 12B are schematic views for comparing the areas of the capacitor elements. FIG. 12A is a schematic view of the capacitor element in the semiconductor integrated circuit device of the present invention and FIG. 12B is a schematic view of the plate-type capacitor element parallel to the plane of the substrate. A capacitor element 51 illustrated in FIG. 12A is a capacitor element which is similar to the capacitor element of the first embodiment of the present invention, and includes a plurality of lower electrodes 54 which form protrusions, side surface insulating films 55 formed on both side surfaces of the lower electrodes 54, and an upper electrode 57 which covers the lower electrodes 54 and the side surface insulating films 55. On the other hand, a capacitor element 61 illustrated in FIG. 12B includes a plate-like lower electrode 64 parallel to the plane of the substrate, an insulating film (not shown) formed on the lower electrode 64, and an upper electrode 67 which covers the lower electrode 64 and the insulating film. In the capacitor element 61 illustrated in FIG. 12B, it is assumed that the area of the capacitor element is a×b. Here, with regard to the capacitor element 51 illustrated in FIG. 12A, the area of the capacitor element with respect to the layout area of a×b is examined. It is assumed that the length of one lower electrode 54 (protrusion) is b, the thickness of a lower electrode 54 and the side surface insulating film 55 on both side surfaces of the lower electrode 54 is t, the distance between the side surface insulating films 55 of adjacent protrusions is d, and the height of the lower electrodes 54 which are the protrusions is H. Further, it is assumed that the capacitance per unit area of the capacitor element 51 of the present invention illustrated in FIG. 12A and the capacitance per unit area of the capacitor element 61 illustrated in FIG. 12B are both Cc.

Here, a capacitance CA of the capacitor element 51 of the present invention illustrated in FIG. 12A is expressed by the following Equation (1) while a capacitance CB of the capacitor element 61 illustrated in FIG. 12B is expressed by the following Equation (2). It is to be noted that, in Equation 1, "a/(t+d)" denotes the number of the lower electrodes (protrusions) 54 and "2" denotes that the side surface insulating film 55 is formed on both side surfaces of the lower electrodes 54.

$$CA = Cc \times 2 \times \{a/(t+d)\} \times b \times H \qquad (1)$$

$$CB = Cc \times a \times b \qquad (2)$$

The difference between Equation 1 and Equation 2 is "2H/(t+d)". Here, according to the technical level at present, the height H of the lower electrodes (protrusions) 54 may be several ten nanometers to several hundred nanometers, the thickness t of the protrusion may be 10 nm to 100 nm, and the distance d between the protrusions may be several ten nanometers to several hundred nanometers, approximately. Therefore, the capacitor element in the semiconductor integrated circuit device of the present invention illustrated in FIG. 12A can materialize area efficiency which is equal to or higher than that of the capacitor element illustrated in FIG. 12B.

The semiconductor integrated circuit device and the method of manufacturing the same according to the present invention are described based on the above-mentioned embodiments, but the present invention is not limited thereto. It goes without saying that various modifications, changes, and improvements can be made to the above-mentioned embodiments within the scope of the present invention and based on the basic technical idea of the present invention. Further, various combinations, replacement, and selection of the disclosed components are possible within the scope of the claims of the present invention.

Further problems, objects, and extended embodiments of the present invention become apparent also from all the disclosed matters of the present invention including the scope of the claims.

What is claimed is:

1. A semiconductor integrated circuit device, comprising:
   a first electrode including a first semiconductor layer formed on a substrate;
   a side surface insulating film formed on at least a part of a side surface of the first electrode;
   an upper surface insulating film formed on the first electrode and the side surface insulating film;
   a second electrode which covers the side surface insulating film and the upper surface insulating film;
   a fin-type field effect transistor; and
   a capacitor element includes the first electrode, the side surface insulating film, and the second electrode, wherein:
   a thickness of the upper surface insulating film between the first electrode and the second electrode is larger than a thickness of the side surface insulating film between the first electrode and the second electrode; and
   the fin-type field effect transistor comprises:
      a second semiconductor layer which protrudes with respect to the plane of the substrate;
      a channel region;
      a source region, region;
      a drain region;
      a gate insulating film formed on the channel region; and
      a gate electrode formed on the gate insulating film.

2. A semiconductor integrated circuit device, comprising:
   a substrate;
   a semiconductor layer formed on the substrate;
   an insulating layer formed on the semiconductor layer;
   an electrode layer formed on the insulating layer;
   a fin-type field effect transistor portion comprising:
      at least a part of the semiconductor layer;
      the insulating layer;
      the electrode layer; and
      a channel region, a source region, and a drain region, which are formed as the semiconductor layer, a gate insulating film formed as the insulating layer, and a gate electrode formed as the electrode layer; and
   a capacitor element portion comprising:
      at least another part of the semiconductor layer;
      the insulating layer;
      the electrode layer; and
      a first electrode formed as the semiconductor layer, an insulating film formed as the insulating layer, and a second electrode formed as the electrode layer, wherein
   a thickness of the insulating film on an upper surface of the first electrode of the capacitor element portion in a direction perpendicular to a plane of the substrate is larger than a thickness of the insulating film on a side surface of the first electrode of the capacitor element portion in a direction parallel to the plane of the substrate.

3. A semiconductor integrated circuit device according to claim 2, wherein a capacitance of a part of the capacitor element portion which is formed on the upper surface of the first electrode is smaller than a capacitance of another part of the capacitor element portion which is formed on the side surface of the first electrode.

4. A semiconductor integrated circuit device according to claim 2, wherein an area of a surface of the capacitor element portion which extends in the direction parallel to the substrate on the upper surface of the first electrode is smaller than an area of another surface of the capacitor element portion which extends in the direction perpendicular to the substrate on the side surface of the first electrode.

5. A semiconductor integrated circuit device according to claim 2, wherein, when the substrate is seen from above, an area occupied by the fin-type field effect transistor portion is larger than an area occupied by the capacitor element portion.

6. A semiconductor integrated circuit device according to claim 2, wherein the fin-type field effect transistor portion and the capacitor element portion are formed in the semiconductor layer which forms a protrusion.

7. A semiconductor integrated circuit device according to claim 1, wherein the source region of the fin-type field, effect transistor comprises an n-type region and the channel region of the fin-type field effect transistor comprises a p-type region.

8. A semiconductor integrated circuit device according to claim 1, wherein the source region of the fin-type field effect transistor comprises a p-type region and the channel region of the fin-type field effect transistor comprises an n-type region.

9. A semiconductor integrated circuit device according to claim 1, wherein a conductivity type of the first electrode is different than a conductivity type of the second electrode.

10. A semiconductor integrated circuit device according to claim 1, wherein the upper surface insulating film includes a plurality of laminated insulating films.

\* \* \* \* \*